United States Patent
Tapily

(10) Patent No.: US 11,152,207 B2
(45) Date of Patent: Oct. 19, 2021

(54) METHOD OF FORMING TITANIUM NITRIDE FILMS WITH (200) CRYSTALLOGRAPHIC TEXTURE

(71) Applicant: Tokyo Electron Limited, Tokyo (JP)

(72) Inventor: Kandabara Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/521,386

(22) Filed: Jul. 24, 2019

(65) Prior Publication Data
US 2020/0035481 A1 Jan. 30, 2020

Related U.S. Application Data

(60) Provisional application No. 62/703,701, filed on Jul. 26, 2018.

(51) Int. Cl.
*H01L 21/02* (2006.01)
*C23C 16/455* (2006.01)
(Continued)

(52) U.S. Cl.
CPC .......... *H01L 21/0234* (2013.01); *C23C 16/34* (2013.01); *C23C 16/45536* (2013.01);
(Continued)

(58) Field of Classification Search
CPC ............. H01L 21/0234; H01L 21/0254; H01L 21/02186; H01L 21/02595; H01L 21/0228; H01L 21/02274; H01L 21/32058; H01L 21/28562; H01L 21/02356; H01L 39/2416; H01L 21/67207; H01L 21/67184;
(Continued)

(56) References Cited

U.S. PATENT DOCUMENTS

| 7,407,876 B2 | 8/2008 | Ishizaka |
| 2002/0155219 A1* | 10/2002 | Wang ................. H01L 21/28556 427/255.391 |

(Continued)

OTHER PUBLICATIONS

Huang et al. ("Huang"), "Effect of NH3 on the growth characterization of TiN filmsat low temperature," Journal of Crystal Growth 240 (2002) 513-520. (Year: 2002).*

(Continued)

*Primary Examiner* — Ahmed N Sefer

(57) ABSTRACT

A substrate processing method is described for forming a titanium nitride material that may be used for superconducting metallization or work function adjustment applications. The substrate processing method includes depositing by vapor phase deposition at least one monolayer of a first titanium nitride film on a substrate, and treating the first titanium nitride film with plasma excited hydrogen-containing gas, where the first titanium nitride film is polycrystalline and the treating increases the (200) crystallographic texture of the first titanium nitride film. The method further includes depositing by vapor phase deposition at least one monolayer of a second titanium nitride film on the treated at (Continued)

least one monolayer of the first titanium nitride film, and treating the at least one monolayer of the second titanium nitride film with plasma excited hydrogen-containing gas.

18 Claims, 7 Drawing Sheets

(51) Int. Cl.
*C23C 16/34* (2006.01)
*H01L 21/3205* (2006.01)
*H01L 21/285* (2006.01)
*H01L 21/67* (2006.01)

(52) U.S. Cl.
CPC .... *C23C 16/45553* (2013.01); *H01L 21/0228* (2013.01); *H01L 21/0254* (2013.01); *H01L 21/02186* (2013.01); *H01L 21/02274* (2013.01); *H01L 21/02356* (2013.01); *H01L 21/02595* (2013.01); *H01L 21/285* (2013.01); *H01L 21/28562* (2013.01); *H01L 21/32058* (2013.01); *H01L 21/67184* (2013.01); *H01L 21/67207* (2013.01)

(58) Field of Classification Search
CPC ... H01L 21/285; H01L 29/517; H01L 29/518; C23C 16/45536; C23C 16/45553; C23C 16/34; C23C 16/45525
See application file for complete search history.

(56) References Cited

U.S. PATENT DOCUMENTS

| | | | |
|---|---|---|---|
| 2004/0106249 A1* | 6/2004 | Huotari | H01L 29/513 |
| | | | 438/216 |
| 2006/0110533 A1 | 5/2006 | Hwang et al. | |
| 2008/0274616 A1 | 11/2008 | Hasegawa | |
| 2012/0115300 A1* | 5/2012 | Hirota | H01L 27/10852 |
| | | | 438/381 |
| 2013/0029848 A1* | 1/2013 | Gonzalez | H01P 1/2013 |
| | | | 505/210 |
| 2015/0099072 A1* | 4/2015 | Takamure | C23C 16/52 |
| | | | 427/577 |
| 2017/0179250 A1* | 6/2017 | Caubet | H01L 21/28088 |
| 2018/0122642 A1* | 5/2018 | Raisanen | H01L 21/28088 |
| 2018/0247974 A1* | 8/2018 | Oliver | H01L 27/18 |

OTHER PUBLICATIONS

Nigamananda et al., "Low-Temperature (<200C) Plasma Enhanced Atomic Deposition of Dense Titanium Nitride Thin Films." (Year: 2013).*

* cited by examiner

METHOD OF FORMING TITANIUM NITRIDE FILMS WITH (200) CRYSTALLOGRAPHIC TEXTURE

CROSS-REFERENCE TO RELATED APPLICATIONS

This application claims priority to U.S. Provisional Patent Application No. 62/703,701, entitled, "Method for Forming Titanium Nitride Films with (200) Crystallographic Texture," filed Jul. 26, 2018; the disclosure of which is expressly incorporated herein, in its entirety, by reference.

FIELD OF THE INVENTION

Embodiments of the invention are in the field of semiconductor processing and, in particular, describe methods of forming titanium nitride films with predominantly (200) crystallographic texture. The titanium nitride films may, for example, be used in superconducting and workfunction tuning applications.

BACKGROUND OF THE INVENTION

New technologies such as artificial intelligence (AI), internet of things (IOT), big data, etc., require increasingly more computing power and several innovative computing technologies are therefore being developed. For example, quantum computing is emerging as one of the leading computing innovations. Quantum computing requires microelectronic circuits that contain superconducting metallization and new methods for depositing superconducting materials are required.

Titanium nitride (TiN) is a refractory material that is known for its hardness and has been used as a wear resistant coating in many industries for decades. Further, TiN has been used in semiconductor devices as a diffusion barrier material and conductive electrode material. TiN is known to have low loss at microwave frequencies which results in possible use in many emerging quantum device architectures. TiN is a superconductor with a bulk $T_c$ of 6.0K, and is therefore an attractive material for use in quantum computing.

TiN thin films have been grown by many methods, including atomic layer deposition (ALD), pulsed layer deposition (PLD), and chemical vapor deposition (CVD), but the most common method for growing TiN thin films for low loss quantum circuits has been reactive sputtering (e.g., magnetron sputtering) where $Ar/N_2$ plasma is used to sputter a titanium target. However, new methods are needed for depositing TiN thin films with preferred crystallographic texture for use in superconducting and workfunction tuning applications, for example.

SUMMARY OF THE INVENTION

A substrate processing method is described for forming a titanium nitride material that may be used for superconducting metallization or work function adjustment applications. The substrate processing method includes depositing by vapor phase deposition at least one monolayer of a first titanium nitride film on a substrate, and treating the first titanium nitride film with plasma excited hydrogen-containing gas, where the first titanium nitride film is polycrystalline and the treating increases the (200) crystallographic texture of the first titanium nitride film. The method further includes depositing by vapor phase deposition at least one monolayer of a second titanium nitride film on the treated at least one monolayer of the first titanium nitride film, and treating the at least one monolayer of the second titanium nitride film with plasma excited hydrogen-containing gas.

A semiconductor device is described that includes a titanium nitride film formed by vapor phase deposition and having a predominantly (200) crystallographic texture.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Embodiments of the invention describe a method for forming TiN films with predominantly (200) crystallographic texture. The TiN films may, for example, be used in superconducting and workfunction tuning applications. TiN films with predominantly (200) crystallographic texture have high superconducting transition temperature and are therefore attractive for use in superconducting applications. Further, treating of the TiN films during deposition to form the predominantly (200) crystallographic texture positively shifts she threshold voltage by between about 0.2V and about 0.4V. This opens up various applications for the use of TiN films for workfunction tuning applications. For example, TiN films may be used as gate electrodes in transistors, where a TiN film is positioned on top of a high-k dielectric film and the TiN film has a specific effective workfunction that sets the threshold voltage for the transistor.

According to one embodiment, a substrate processing method is described. The substrate processing method includes depositing by vapor phase deposition at least one monolayer of a first titanium nitride film on a substrate, and thereafter, treating the at least one monolayer of the first titanium nitride film with plasma excited hydrogen-containing gas, where the first titanium nitride film is polycrystalline and the treating increases the (200) crystallographic texture of the first titanium nitride film. The method further includes depositing by vapor phase deposition at least one monolayer of a second titanium nitride film on the treated at least one monolayer of the first titanium nitride film, and thereafter, treating the at least one monolayer of the second titanium nitride film with plasma excited hydrogen-containing gas. According to embodiments of the invention, the hydrogen-containing gas may be selected from the group consisting of $H_2$, $NH_3$, $N_2H_4$, H radicals, and a combination thereof. The vapor phase deposition can, for example, include ALD, CVD, or physical vapor deposition (PVD). The treated first titanium nitride film has predominantly (200) crystallographic texture that aids in forming the second titanium nitride film also with predominantly (200) crystallographic texture. Together, the first and titanium nitride films form a titanium nitride material with predominantly (200) crystallographic texture.

Figure 1:
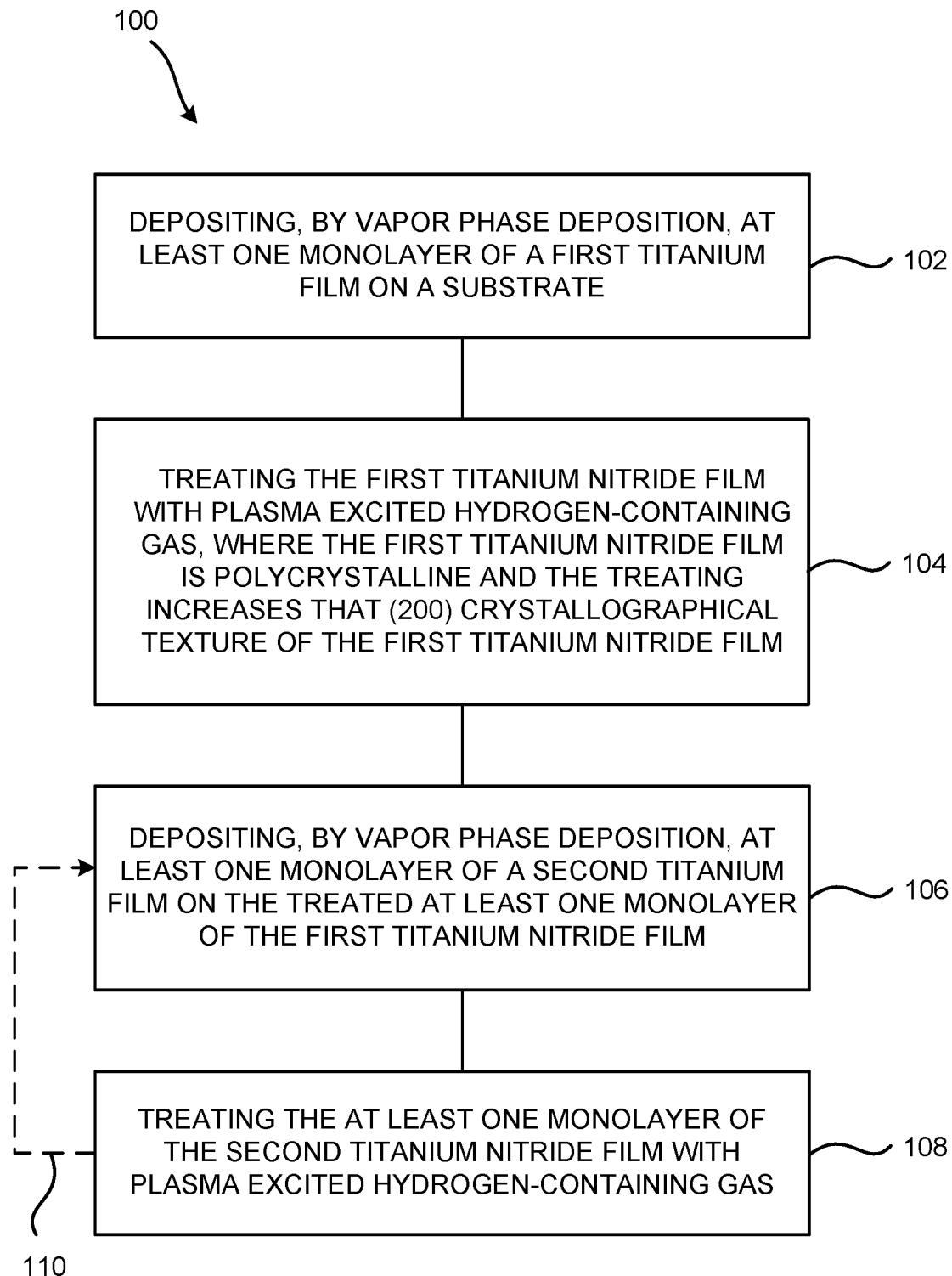
FIG. 1 shows a process sequence for forming a TiN film according to an embodiment of the invention.

FIG. 1 shows a process sequence for forming a TiN film according to an embodiment of the invention. The process sequence 100 includes in 102, depositing, by vapor phase deposition, at least one monolayer of a first titanium nitride film on a substrate, and thereafter, in 104, treating the at least one monolayer of the first titanium nitride film with plasma excited hydrogen-containing gas, where the first titanium nitride film is polycrystalline and the treating increases the (200) crystallographic texture of the first titanium nitride film.

The process sequence 100 further includes, in 106, depositing, by vapor phase deposition, at least one monolayer of a second titanium nitride film on the treated at least one monolayer of the first titanium nitride film, and thereafter, in 108, and treating the at least one monolayer of the second titanium nitride film with plasma excited hydrogen-containing gas.

The depositing in 102 may be carried out by performing a first plurality of cycles of atomic layer deposition and the depositing in 106 may be carried out by performing a second plurality of cycles of atomic layer deposition.

According to some embodiments, the process sequence can further include annealing the first titanium film, the second titanium film, or both the first and second titanium films to further increase the (200) crystallographic texture of the titanium material. The annealing may be performed after depositing of the first titanium film but before the treating of the first titanium film, after the treating of the first titanium film but before depositing the second titanium film, after depositing of the second titanium film but before the treating of the second titanium film, after the treating of the second titanium film, or a combination of one more thereof.

In some embodiments, the process sequence can further include performing additional depositing and treating steps to increase a thickness of the titanium nitride material. This is schematically shown by process arrow 110 in FIG. 1. In some examples, the first plurality of cycles can be between 2 and about 50, between 2 and 10, between 10 and 30, or between 30 and 50. In some examples, the second plurality of cycles can be between 2 and about 50, between 2 and 10, between 10 and 30, between 30 and 50.

According to one embodiment, the treating steps 104 and 108 positively shift the threshold voltage of the TiN film, for example by between about 0.2V and about 0.4V.

The TiN film may be deposited by ALD using alternating exposures of a Ti-containing precursor and a nitrogen-containing precursor. The Ti-containing precursors may be selected from titanium nitride precursors and titanium precursors. Titanium nitride precursors can contain both titanium and nitrogen in the same molecule but a separate nitrogen precursor (e.g., $NH_3$ or plasma excited $N_2$) may be added as an additional source of nitrogen. Representative examples of titanium nitride precursor having "Ti—N" intra-molecular bonds include $Ti(NEt_2)_4$ (TDEAT), $Ti(NMeEt)_4$ (TEMAT), $Ti(NMe_2)_4$ (TDMAT). Titanium-containing precursors can include $TiF_5$ and $TiCl_5$ and precursors containing "Ti—C" intra-molecular bonds include, for example, $Ti(COCH_3)(\eta^5-C_5H_5)_2Cl$, $Ti(\eta^5-C_5H_5)Cl_2$, $Ti(\eta^5-C_5H_5)Cl_3$, $Ti(\eta^5-C_5H_5)_2Cl_2$, $Ti(\eta^5-C_5(CH_3)_5)Cl_3$, $Ti(CH_3)(\eta^5-C_5H_5)_2Cl$, $Ti(\eta^5-C_9H_7)_2Cl_2$, $Ti((\eta^5-C_5(CH_3)_5)_2Cl$, $Ti((\eta^5-C_5(CH_3)_5)_2Cl_2$, $Ti(\eta^5-C_5H_5)_2(\mu-Cl)_2$, $Ti(\eta^5-C_5H_5)_2(CO)_2$, $Ti(CH_3)_3(\eta^5-C_5H_5)$, $Ti(CH_3)_2(\eta^5-C_5H_5)_2$, $Ti(CH_3)_4$, $Ti(\eta^5-C_5H_5)(\eta^7-C_7H_7)$, $Ti(\eta^5-C_5H_5)(\eta^8-C_8H_8)$, $Ti(C_5H_5)_2(\eta^5-C_5H_5)_2$, $Ti((C_5H_5)_2)_2(\eta-H)_2$, $Ti(\eta^5-C_5(CH_3)_5)_2$, $Ti(\eta^5-C_5(CH_3)_5)_2(H)_2$, and $Ti(CH_3)_2(\eta^5-C_5(CH_3)_5)_2$. The nitrogen-containing precursor can be selected from $NH_3$, plasma excited $NH_3$, plasma excited $N_2$, $NH(CH_3)_2$, $N_2H_4$, or $N_2H_3CH_3NH_3$, or a combination of two or more thereof.

Figure 2:
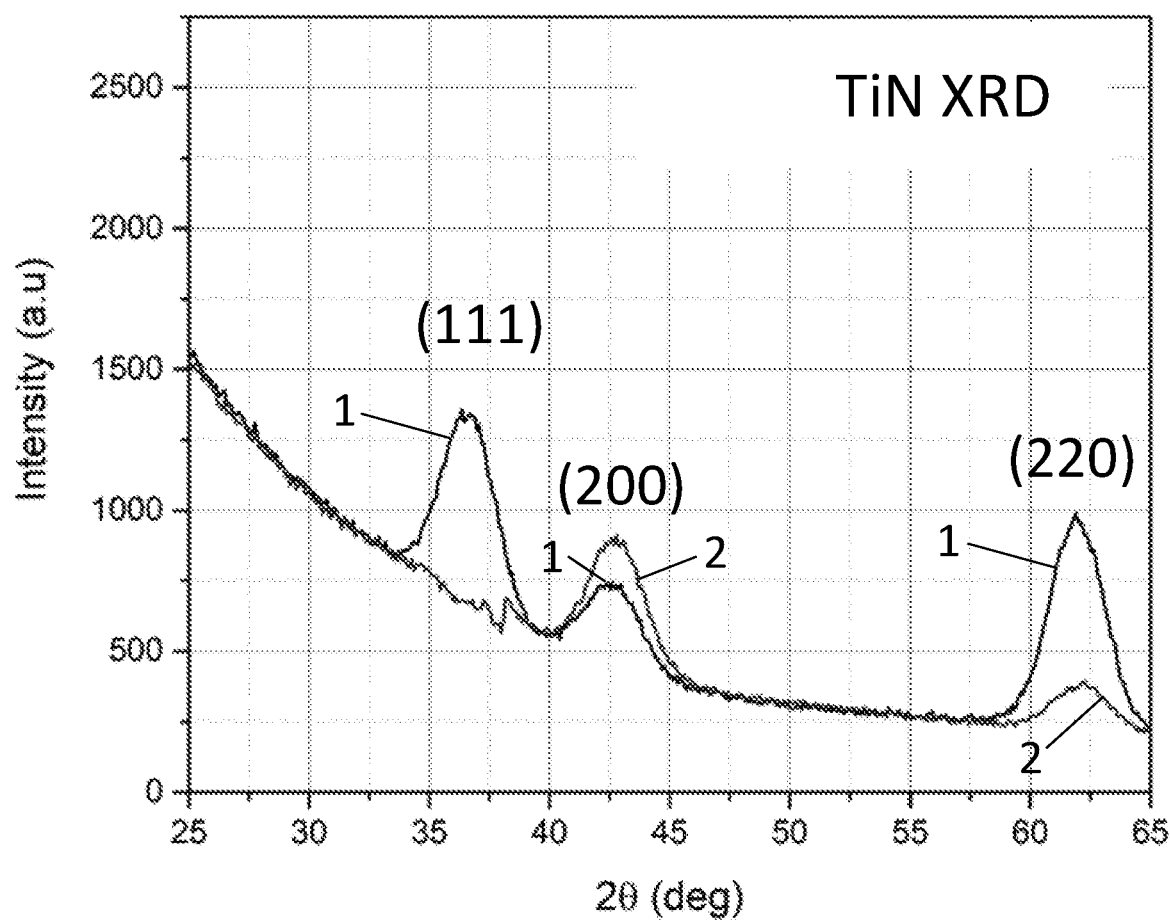
FIG. 2 shows X-ray Diffraction (XRD) Spectra of TiN films according to an embodiment of the invention.

FIG. 2 shows XRD Spectra of TiN films according to an embodiment of the invention. The TiN films were deposited by ALD using alternating exposure of $TiCl_4$ and $NH_3$. The first TiN film 1 was formed without treating the deposited TiN film with plasma excited $H_2$ gas. The second TiN film 2 was formed by intermittently treating the deposited TiN film with plasma excited $H_2$ gas. The XRD spectra show three crystallographic textures for TiN: (111) at about 37 deg., (200) at about 42.5 deg., and (220) at about 62 deg. The first TiN film 1 was polycrystalline and the XRD shows prominent (111), (200), and (220) crystallographic textures. In contrast, the second TiN film 2 had predominantly (200) crystallographic texture and no measured (111) crystallographic texture. The results in FIG. 2 clearly illustrate that TiN films with predominantly (200) crystallographic texture may be formed using the process sequence in FIG. 1 that includes intermittent treatment of deposited TiN films with plasma excited $H_2$ gas.

According to one embodiment, the method includes depositing a TiN film with predominantly (200) crystallographic texture and, thereafter, performing a dry etching process (e.g., atomic layer etching (ALE)) to thin the TiN film, where the thinned TiN film also has predominantly (200) crystallographic texture. This provides a method for initially depositing a thick TiN film and thereafter thinning the thick TiN film to a desired thickness, while maintaining the predominantly (200) crystallographic texture. In one example, the dry etching process includes the use of a halogen gas, or example a fluorine-containing gas. In one example, the dry etching process includes the use of a plasma for forming a plasma excited etching gas. For example, the dry etching process may include $CHF_3$ or $Cl_2$ as a reactive gas. The dry etching process may further include inert gases such as Ar, $N_2$, etc. In one example the dry etching process can use plasma excited $CHF_3$+Ar or plasma excited $Cl_2$+Ar. In other examples, the ALE process may include the use of a boron (B)-containing gas or an aluminum (Al)-containing gas and a fluorine-containing gas. For example, the ALE process may include the use of $BCl_3$ and HF. In another example the ALE process may include oxidizing all or a portion of the TiN film prior to removing the TiN film.

Figure 3:
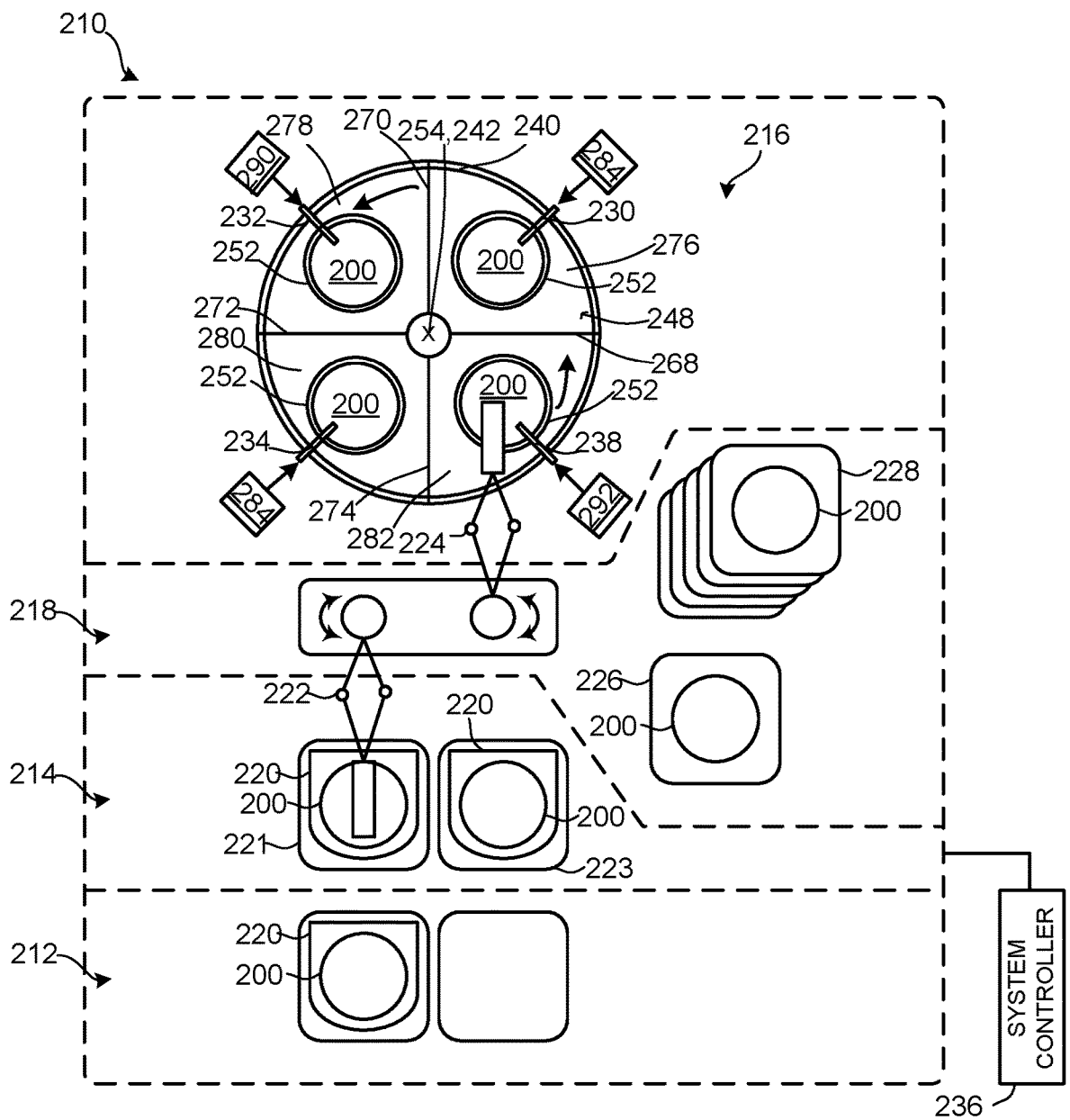
FIG. 3 is a diagrammatic top plan view of a deposition system configured for forming a TiN film according to an embodiment of the invention.

FIG. 3 is a diagrammatic top plan view of a deposition system configured for forming TiN films according to an embodiment of the invention. A batch processing system 210 for processing a plurality of substrates 200 comprises an input/output station 212, a load/lock station 214, a process chamber 216, and a transfer chamber 218 interposed between the load/lock station 214 and process chamber 216. The batch processing system 210, which is shown in a simplified manner, may include additional structures, such as additional vacuum-isolation walls coupling the load/lock station 214 with the transfer chamber 218 and the process chamber 216 with the transfer chamber 218, as understood by a person having ordinary skill in the art. The input/output station 212, which is at or near atmospheric pressure (e.g., 760 Torr), is adapted to receive wafer cassettes 220, such as front opening unified pods (FOUPs). The wafer cassettes 220 are sized and shaped to hold a plurality of substrates 200, such as semiconductor wafers having diameters of, for example, 200 or 300 millimeters.

The load/lock station 214 is adapted to be evacuated from atmospheric pressure to a vacuum pressure and to be vented from vacuum pressure to atmospheric pressure, while the process chamber 216 and transfer chamber 218 are isolated and maintained continuously under vacuum pressures. The load/lock station 214 holds a plurality of the wafer cassettes 220 introduced from the atmospheric pressure environment of the input/output station 212. The load/lock station 214 includes platforms 221, 223 that each support one of the wafer cassettes 220 and that can be vertically indexed to promote wafer transfers to and from the process chamber 216.

A wafer transfer mechanism 222 transfers substrates 200 under vacuum from one of the wafer cassettes 220 in the load/lock station 214 through the transfer chamber 218 and into the process chamber 216. Another wafer transfer mechanism 224 transfers substrates 200 processed in the process chamber 216 under vacuum from the process chamber 216 through the transfer chamber 218 and to the wafer cassettes 220. The wafer transfer mechanisms 222, 224, which operate independently of each other for enhancing the throughput of the batch processing system 210, may be selective compliant articulated/assembly robot arm (SCARA) robots commonly used for pick-and-place operations. The wafer transfer mechanisms 222, 224 include end effectors configured to secure the substrates 200 during transfers. The process chamber 216 may include distinct first and second sealable ports (not shown) used by wafer transfer mechanisms 222, 224, respectively, to access processing spaces inside the process chamber 216. The access ports are sealed when a deposition or etch process is occurring in the process chamber 216. Wafer transfer mechanism 222 is depicted in FIG. 3 as transferring unprocessed substrates 200 from wafer cassettes 220 on platform 221 of the load/lock station 214 to the process chamber 216. Wafer transfer mechanism 224 is depicted in FIG. 3 as transferring processed substrates 200 from the process chamber 216 to wafer cassettes 220 on platform 223 of the load/lock station 214.

The wafer transfer mechanism 224 may also transfer processed substrates 200 extracted from the process chamber 216 to a metrology station 226 for examination or to a cool down station 228 used for post-processing low pressure cooling of the substrates 200. The processes performed in the metrology station 226 may include, but are not limited to, conventional techniques used to measure film thickness and/or film composition, such as ellipsometry, and particle measurement techniques for contamination control.

The batch processing system 210 is equipped with a system controller 236 programmed to control and orchestrate the operation of the batch processing system 210. The system controller 236 typically includes a central processing unit (CPU) for controlling various system functions, chamber processes and support hardware (e.g., detectors, robots, motors, gas sources hardware, etc.) and monitoring the system and chamber processes (e.g., chamber temperature, process sequence throughput, chamber process time, input/output signals, etc.). Software instructions and data can be coded and stored within the memory for instructing the CPU. A software program executable by the system controller 236 determines which tasks are executed on substrates 200 including tasks relating to monitoring and execution of the processing sequence tasks and various chamber process recipe steps.

A susceptor 248 is disposed inside the process chamber 216. The susceptor 248 includes a plurality of circular substrate supports 252 defined in a top surface of the susceptor 248. Each of the substrate supports 252 is configured to hold at least one of the substrates 200 at a location radially within the peripheral sidewall 240 of the process chamber 216. The number of individual substrate supports 252 may range, for example, from 2 to 8. However, a person having ordinary skill in the art would appreciate that the susceptor 248 may be configured with any desired number of substrate supports 252 depending on the dimensions of the substrates 200 and the dimensions of the susceptor 248. Although this embodiment of the invention is depicted as having substrate supports 252 of a circular or round geometrical shape, one of ordinary skill in the art would appreciate that the substrate supports 252 may be of any desired shape to accommodate an appropriately shaped substrate.

The batch processing system 210 may be configured to process 200 mm substrates, 300 mm substrates, or larger-sized round substrates, which dimensioning will be reflected in the dimensions of substrate supports 252. In fact, it is contemplated that the batch processing system 210 may be configured to process substrates, wafers, or liquid crystal displays regardless of their size, as would be appreciated by those skilled in the art. Therefore, while aspects of the invention will be described in connection with the processing of substrates 200 that are semiconductor substrates, the invention is not so limited.

The substrate supports 252 are distributed circumferentially on the susceptor 248 about a uniform radius centered on an axis of rotation 254. The substrate supports 252 have approximately equiangular spacing about the axis of rotation 254, which is substantially collinear or coaxial with the azimuthal axis 242 although the invention is not so limited.

When the substrates 200 are processed in the process chamber 216, the rotation of the susceptor 248 may be continuous and may occur at a constant angular velocity about the axis of rotation 254. Alternatively, the angular velocity may be varied contingent upon the angular orientation of the susceptor 248 relative to an arbitrary reference point.

Partitions 268, 270, 272, 274 compartmentalize the process chamber 216 into a plurality of processing spaces 276, 278, 280, 282, while allowing the susceptor 248 and the substrate supports 252 to freely rotate around the axis of rotation 254. The partitions 268, 270, 272, 274 extend radially relative to the axis of rotation 254 toward the peripheral sidewall 240. Although four partitions 268, 270, 272, 274 are representatively shown, a person having ordinary skill in the art would appreciate that the process chamber 216 may be subdivided with any suitable plurality of partitions to form a different number than four processing spaces. Alternatively, the partitions 268, 270, 272, 274 may be replaced by gaseous curtains.

The batch processing system 210 further includes a purge gas supply system 284 coupled by gas lines to gas injectors 230, 234 penetrating through the peripheral sidewall 240. The purge gas supply system 284 is configured to introduce a flow of a purge gas to processing spaces 276 and 280. The purge gas introduced into the processing spaces 276 and 280 can comprise an inert gas, such as a noble gas (i.e., helium, neon, argon, xenon, krypton), nitrogen, or hydrogen. During substrate processing, purge gas may be continuously introduced into the processing spaces 276 and 280 to provide a gaseous curtain or barrier preventing, or at the least significantly limiting, gaseous transfer of first and second process materials between processing spaces 278, 282. The purge gas also provides an inert atmosphere inside processing spaces 276, 280 so that any process material layers carried by the substrates 200 are substantially unchanged when transported on the susceptor 248 through processing spaces 276, 280. Processing space 278 is juxtaposed between processing spaces 276, 280 and processing space 282 is juxtaposed between processing spaces 276, 280 so that processing spaces 276, 280 separate processing spaces 278 and 282 to provide mutual isolation for the first and second process materials.

Batch processing system 210 further includes a first process material supply system 290 coupled by gas lines to gas injector 232 penetrating through the peripheral sidewall 240, and a second process material supply system 292 coupled by gas lines to gas injector 238 penetrating through the peripheral sidewall 240. The first process material supply system 290 is configured to introduce a first process material to processing space 278, and a second process material supply system 292 configured to introduce a second process material to processing space 282. The first and second process material supply systems 290, 292 may each include one or more material sources, one or more heaters, one or more pressure control devices, one or more flow control devices, one or more filters, one or more valves, or one or more flow sensors as conventionally found in such process material supply systems.

The first process material can, for example, comprise a precursor, such as a composition having the principal atomic or molecular species found in a film formed on each of the substrates 200. For example, the precursor can originate as a solid phase, a liquid phase, or a gaseous phase, and it may be delivered to processing space 278 in either a gaseous or vapor phase, and either with or without the assistance of a carrier gas. The second process material can, for example, comprises a reactant, which may also have atomic or molecular species found in the film formed on substrates 200. For instance, the reactant can originate as a solid phase, a liquid phase, or a gaseous phase, and it may be delivered to processing space 282 in either a gaseous or vapor phase, and either with or without the assistance of a carrier gas.

The first process material supplied by the first process material supply system 290 to process chamber 216 and the second process material supplied by the second process material supply system 292 to process chamber 216 are selected in accordance with the composition and characteristics of a material to be deposited as the thin film on the substrate. For example, the first process material can include a titanium-containing precursor and the second process material can include a nitrogen-containing precursor. The temperature and pressure of the first and second process materials are also selected to promote thin film growth.

According to one embodiment, one or more of the first process material supply system 290, the second process material supply system 292, and the purge gas supply system 284 may be further configured for injecting an etching gas into one or more of the processing spaces 276, 278, 280, 282.

When the susceptor 248 is rotated about the axis of rotation 254, the arrangement of the substrate supports 252 about the circumference of the susceptor 248 allows each substrate 200 to be sequentially exposed to the different environment inside each of the processing spaces 276, 278, 280, 282. By way of example, upon rotation of the susceptor 248 through a closed path of $2\pi$ radians (360°), each of the substrates 200 is serially exposed to first process material in the environment inside the first processing space 278, then to the purge gas comprising the environment inside the second processing space 280, then to the second process material in the environment inside the third processing space 282, and finally to the purge gas comprising the environment inside the fourth processing space 276. Each of the substrates 200 has a desired dwell time in each of the respective processing spaces 276, 278, 280, 282, as mandated by the characteristics of the film to be deposited on each of the substrates 200, sufficient to form the film.

The deposition process is a deposition technique in which deposition of each atomic layer of the thin film, or a fraction thereof, on the substrates 200 is controlled by alternating and sequential introduction of appropriate gas phase precursors that react in a self-limiting manner to incrementally form or build the thin film. Within the first processing space 278, molecules of the first process material bond (chemically, by absorption, by adsorption, etc.) to the top surface of each of the substrates 200 to form a monolayer or a fraction of a monolayer of the first process material. Within the third processing space 282, the second process material reacts with the molecules of the first process material on each successive substrate 200. As the substrates 200 are rotated through the first and third processing spaces 278, 282, these steps are repeated with sequential subsequent exposures to the first and second process materials. The environments of first and second process materials in the first and third processing spaces 278, 282, respectively, are isolated from each other by the chemically non-reactive, purge gas environments inside the second and fourth processing spaces 280, 276.

The substrates 200 may be heated to a process temperature to promote the deposition process. In comparison with predominantly thermally driven CVD processes, ALD is predominantly chemically driven. Accordingly, ALD may be conducted at significantly lower substrate temperatures than CVD.

According to one embodiment of the invention, the first process material supply system 290 includes a plasma source that supplies the first process material to processing space 278 in the form of a plasma product comprising ions, radicals, or a combination thereof. Furthermore, the second process material supply system 292 may include a plasma source that supplies the second process material to processing space 282 in the form of a plasma product comprising ions, radicals, or a combination thereof. Further, in order to provide anisotropic etching, the substrate supports 252 may be electrically biased. In one example, rotation of the susceptor 248 may need to be stopped during the electrical biasing.

According to one embodiment of the invention, the purge gas supply system 284 may include a plasma source that supplies plasma excited hydrogen-containing gas into one or more of the processing spaces 276, 280 to treat a TiN film as described in the process sequence of FIG. 1.

In one example, a first TiN film may be deposited on each substrate 200 by a gas phase exposure to a titanium-containing precursor in the first processing space 278, followed by an exposure to a nitrogen-containing precursor in the third processing space 282. These sequential exposures may be repeated A number of times. After a plurality of exposure cycles to deposit the first TiN film on the substrates 200, the first TiN film may be treated with plasma excited hydrogen-containing gas in the second or fourth processing spaces 280, 276. The plasma exposure treating may be performed B number of times. The sequential exposures and the plasma exposure treating may be repeated a total of C number of times. In other words, the first TiN film may be formed by performing: (A×(titanium-containing precursor exposure, followed by nitrogen-containing precursor exposure)+B×(plasma exposure treating))×C, where A represent the number times the sequential exposures are performed for depositing the first TiN film, B represents the number of times the plasma exposure is performed, and C represents the number of times the sequential exposures and the plasma exposure treating are repeated. C may also be called the number of super cycles. Thereafter, the plurality of exposure cycles may be repeated to deposit a second TiN film on the treated first TiN film.

Figure 4:
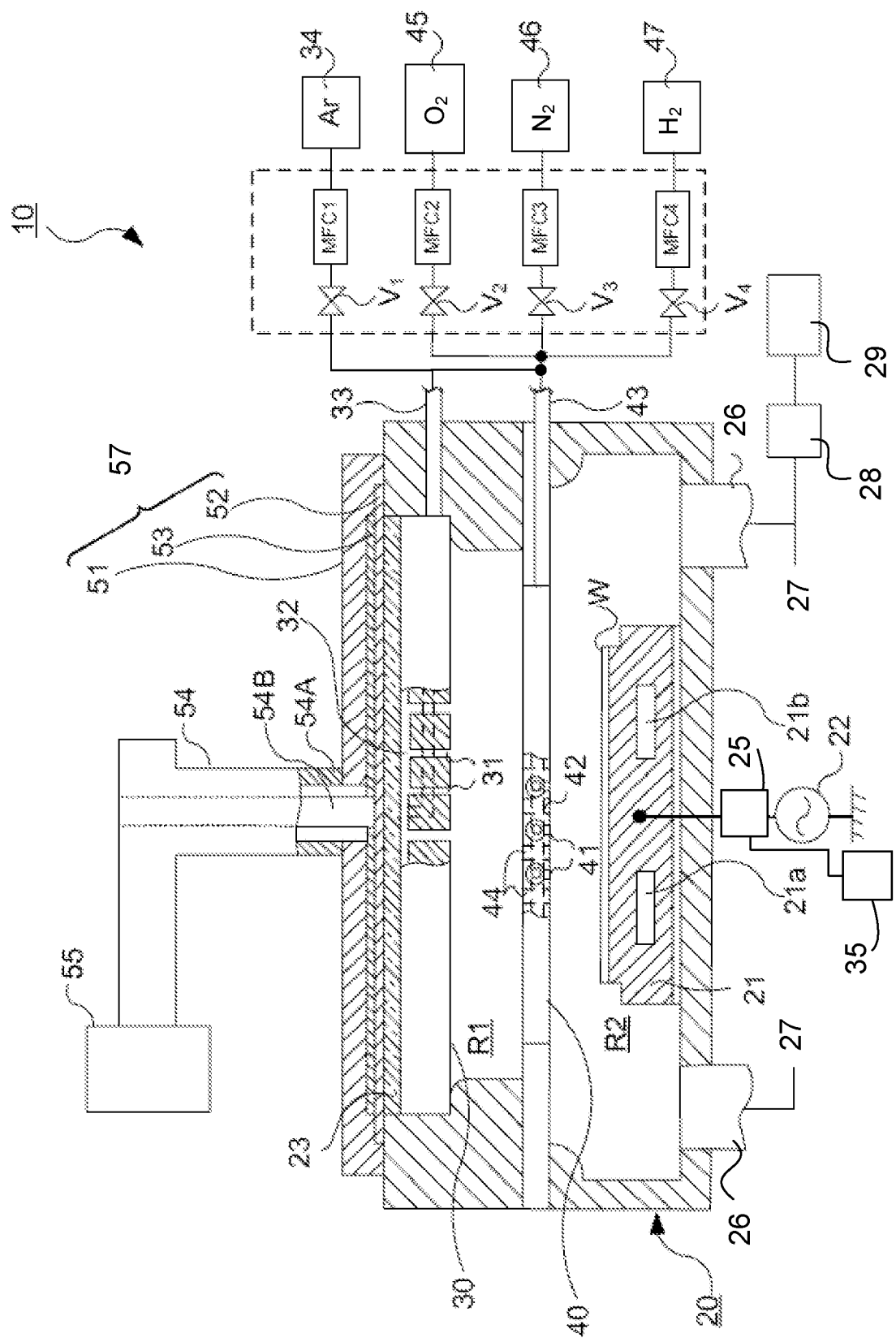
FIG. 4 is a schematic diagram of a plasma processing system containing a microwave plasma source for treating a TiN film according to an embodiment of the invention.

FIG. 4 is a schematic diagram of a plasma processing system containing a microwave plasma source for treating a TiN film according to an embodiment of the invention. The plasma processing system 10 includes a plasma processing chamber 20 (vacuum chamber), an antenna unit 57, and a substrate holder 21.

The interior of the plasma processing chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, wherein the film formation or film treatment process is performed, the electron temperature of the plasma near the substrate holder 21 drops to a value of lower than about 2 eV. The substrate holder 21 is located centrally on a bottom portion of the plasma processing chamber 20 and serves as a mounting unit for mounting a substrate W. Within the substrate holder 21, there is provided an insulating member 21*a*, a cooling jacket 21*b*, and a temperature control unit, not shown in this figure, for controlling the substrate temperature.

A top portion of the plasma processing chamber 20 is open-ended. The plasma gas supply unit 30 is placed opposite to the substrate holder 21 and is sealed with the top portion of the plasma processing chamber 20 via sealing members, not shown in this figure, such as O rings. The plasma gas supply unit 30, which may also function as a dielectric window, is made of materials such as aluminum oxide or quartz, and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. A plasma gas supply source 34 provides plasma gas such as HYDROGEN-CONTAINING gas, Ar gas, or other inert gases, into the plasma gas supply port 33. The plasma gas is then uniformly supplied into the plasma generation region R1 via the plurality of gas supply holes 31.

The plasma processing system 10 further includes a process gas supply unit 40, which is located substantially at the center of the plasma processing chamber 20 between the plasma generation region R1 and the plasma diffusion region R2. The process gas supply unit 40 is made of conducting materials such as aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a disk shape.

The plasma processing chamber 20 further includes exhaust lines 26 connected to the bottom portion of the plasma processing chamber 20, a vacuum line 27 connecting the exhaust line to a pressure controller valve 28 and to a vacuum pump 29. The pressure controller valve 28 may be used to achieve a desired gas pressure in the plasma processing chamber 20.

Figure 5:
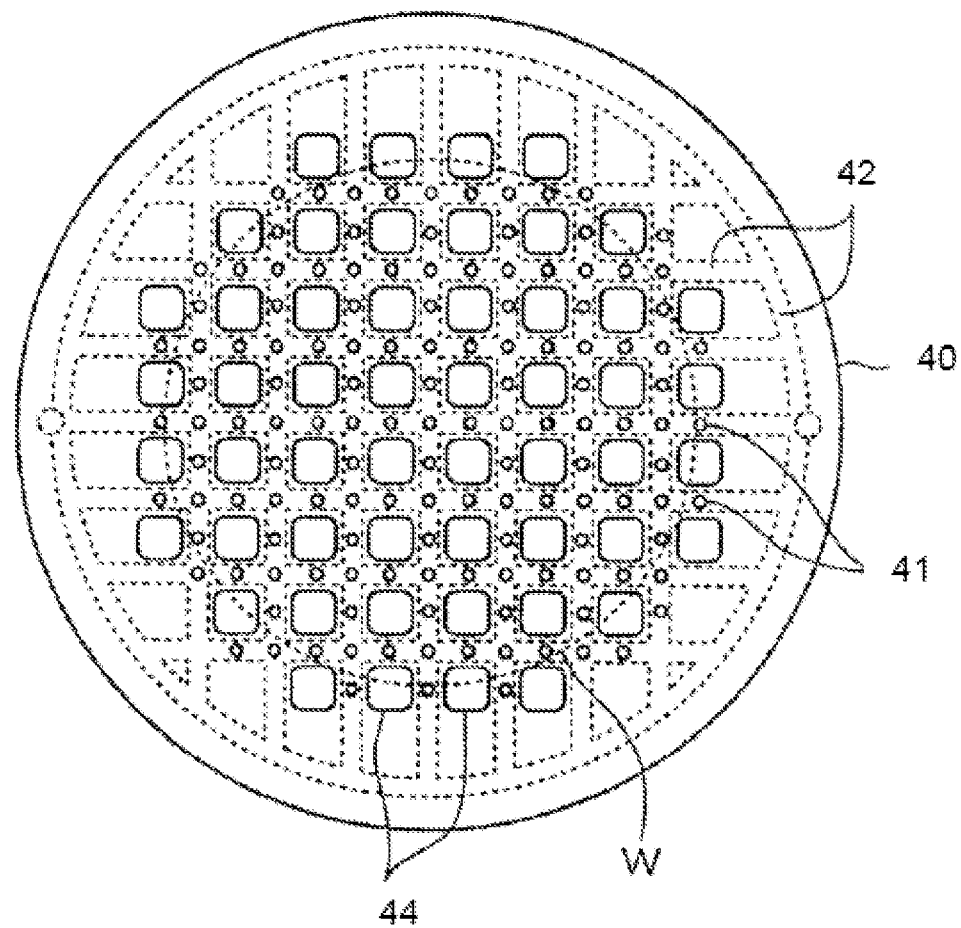
FIG. 5 illustrates a plan view of a gas supplying unit of the plasma processing system in FIG. 4.

A plan view of the process gas supply unit 40 is shown in FIG. 5. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. The plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., hydrogen-containing gas, Ar gas, He gas, or other inert gases, into the plasma diffusion region R2 on the side of the substrate holder 21. As shown in FIG. 4, the plurality of openings 44 are formed between the adjacent gas flow channels 42. The process gas is supplied, for example, from separate process gas supply sources 34, 45-47 to the process gas supply port 43. The process gas supply sources 45 and 46 can provide $O_2$ and $N_2$, respectively. A gas supply source 47 is provided for supplying a hydrogen-containing gas. According to some embodiments, any combination of Ar (and/or He), and a hydrogen-containing gas may be flowed through the process gas supply unit 40 and/or through the plasma gas supply port 33. Furthermore, for example, the plurality of openings 44 may occupy a region on the process gas supply unit 40 that extends beyond a peripheral edge of the substrate W.

The process gas flows through the grid-like gas flow channel 42 and are uniformly supplied into the plasma diffusion region R2 via the plurality of gas supply holes 41. The plasma processing system 10 further includes four valves (V1-V4) and four flow rate controller (MFC1-MFC4) for respectively controlling a supply of the gases into the plasma processing chamber 20.

An external microwave generator 55 provides a microwave signal (or microwave energy) of a predetermined frequency, e.g., 2.45 GHz, to the antenna unit 57 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the process gas within the plasma processing chamber 20.

Figure 6:
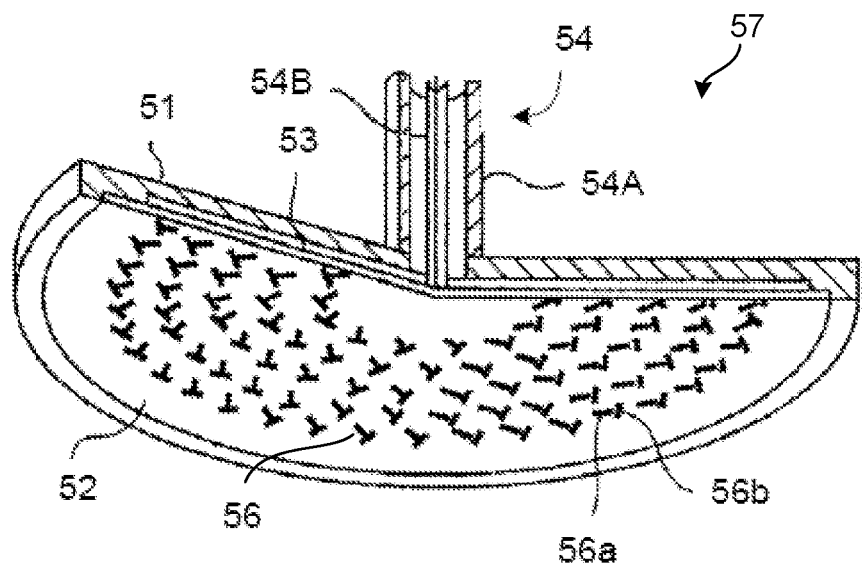
FIG. 6 illustrates a partial cross-sectional view of an antenna portion of the plasma processing system in FIG. 4.

FIG. 6 illustrates a partial cross-sectional view of the antenna unit 57. As shown in this figure, the antenna unit 57 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 is provided on the radial line slot plate 52 to generate a circular polarized wave. The plurality of slots 56 is arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. The radial line slot plate 52 is mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between about −5 kV and about +5 kV to the substrate holder 21.

During the treating of a TiN film, the plasma gas, e.g., a hydrogen-containing gas, may be introduced into the plasma processing chamber 20 using the plasma gas supply unit 30. In addition, or alternatively, a hydrogen-containing gas may be introduced into the plasma processing chamber 20 using the process gas supply unit 40.

Figure 7A:
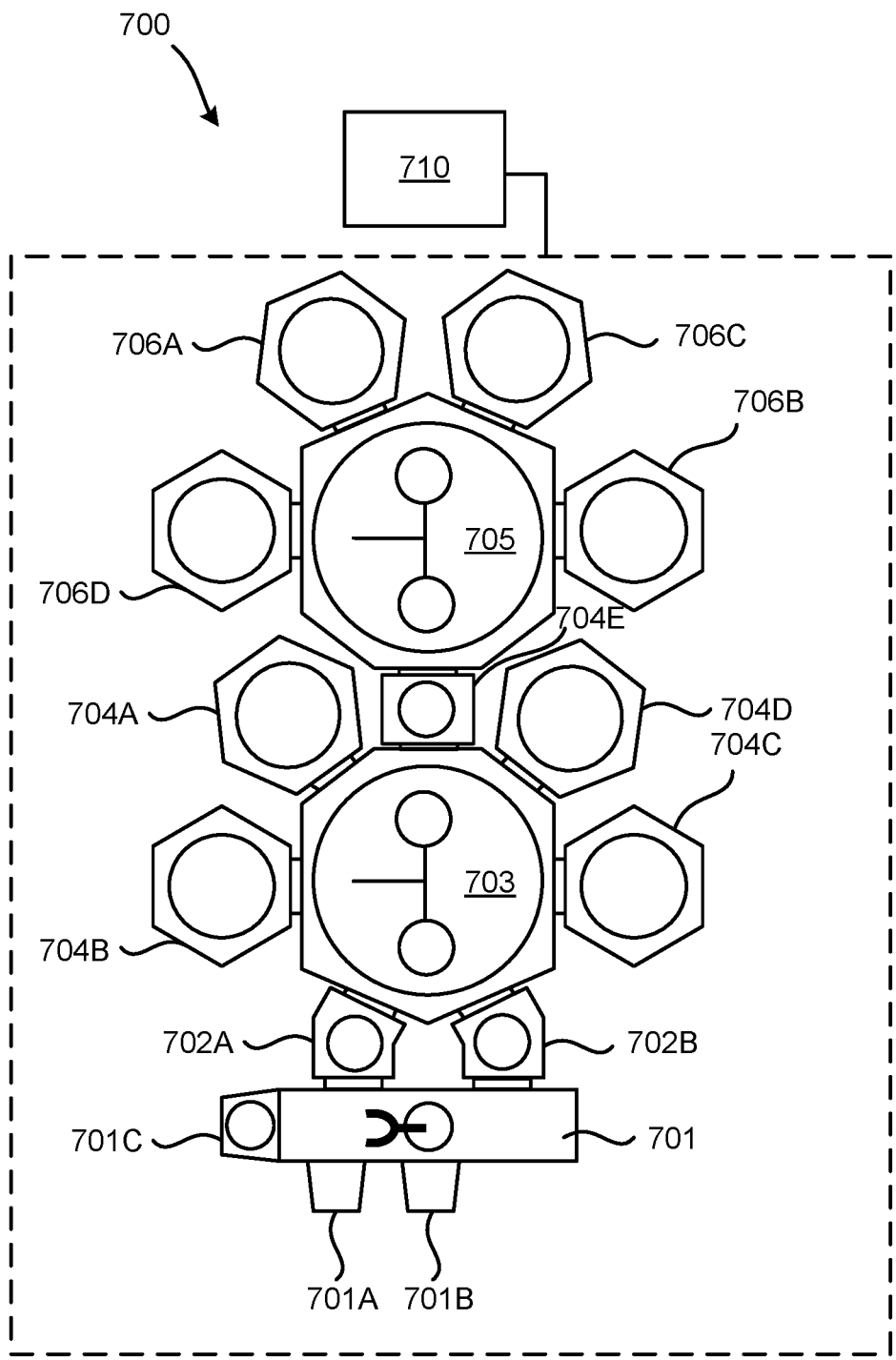
FIG. 7A is a schematic diagram of a cluster tool for forming and integrating TiN films into superconducting metallization.

FIG. 7A is a schematic diagram of a cluster tool for forming and integrating TiN films into superconducting metallization. The cluster tool contains TiN deposition chambers and plasma treatment (e.g., plasma excited hydrogen-containing gas treatment) chambers for forming TiN films with predominantly (200) crystallographic texture, and integrating the TiN films into superconducting metallization devices in PVD process chambers without exposing the TiN films to air. The PVD process chambers may be used to deposit metals or metal-containing materials to use in combination with the TiN films.

The cluster tool 700 contains a substrate (wafer) transfer system 701 that includes cassette modules 701A and 701B, and a substrate alignment module 701C. Load-lock chambers 702A and 702B are coupled to the substrate transfer system 701. The substrate transfer system 701 is maintained at atmospheric pressure but a clean environment is provided by purging with an inert gas.

The load-lock chambers 702A and 702B are coupled to a substrate transfer system 703. The substrate transfer system 703 may be maintained at a very low base pressure (e.g., $5 \times 10^{-8}$ Torr, or lower), using a turbomolecular pump (not shown). The substrate transfer system 703 includes a substrate transfer robot and is coupled to TiN deposition systems 704B and 704C (e.g., batch processing system 210 in FIG. 3), and plasma processing systems 704A and 704D (e.g., plasma processing system 10 in FIGS. 4-6 containing a microwave plasma source) configured for treating a TiN film. According to other embodiments, one or more of the plasma processing systems 704A and 704D can include an inductively coupled plasma (ICP) source or a capacitively coupled plasma (CCP) source.

Furthermore, the substrate transfer system 703 is coupled to a substrate transfer system 705 through substrate handling chamber 704E. As in the substrate transfer system 703, the substrate transfer system 705 may be maintained at a very low base pressure (e.g., $5 \times 10^{-8}$ Torr, or lower), using a turbomolecular pump (not shown). The substrate transfer system 705 includes a substrate transfer robot. Coupled to the substrate transfer system 705 are processing systems 706A-706D configured for depositing metals or metal-containing materials to use in combination with the TiN films.

As described above, the cluster tool 700 may contain two or more processing system configured for performing the same or similar processing. This may be done in order to increase wafer throughput of the cluster tool 700. Thus, some embodiments of the invention may include the use of less than all the processing systems depicted in FIG. 7A.

The cluster tool 700 includes a controller 710 that can be coupled to and control any or all of the processing systems and processing elements depicted in FIG. 7A during the integrated substrate processing. Alternatively, or in addition, controller 710 can be coupled to one or more additional controllers/computers (not shown), and controller 710 can obtain setup and/or configuration information from an additional controller/computer. The controller 710 can be used to configure any or all of the processing systems and processing elements, and the controller 710 can collect, provide, process, store, and display data from any or all of the processing systems and processing elements. The controller 710 can comprise a number of applications for controlling any or all of the processing systems and processing elements. For example, controller 710 can include a graphic user interface (GUI) component (not shown) that can provide easy to use interfaces that enable a user to monitor and/or control one or more processing systems and processing elements.

Figure 7B:
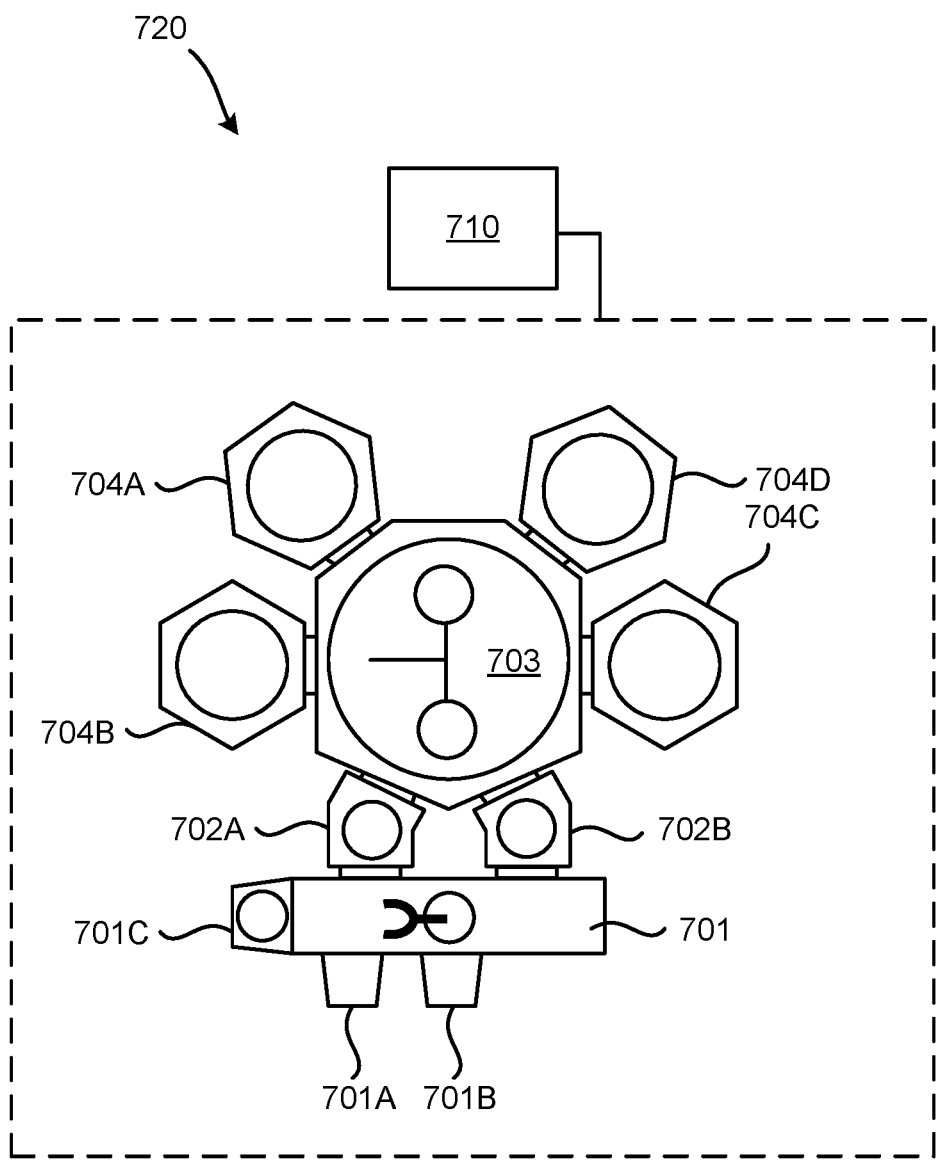
FIG. 7B is a schematic diagram of a cluster tool for forming and integrating TiN films into workfunction tuning applications.

FIG. 7B is a schematic diagram of a cluster tool for forming and integrating a TiN film into workfunction tuning applications. The cluster tool 720 is similar to the cluster tool 700 in FIG. 7A and contains TiN deposition chambers and plasma treatment (e.g., plasma excited hydrogen-containing gas treatment) chambers for forming TiN films with predominantly (200) crystallographic texture without exposing the TiN films to air.

A plurality of embodiments for methods for forming TiN films with predominantly (200) crystallographic texture have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A substrate processing method, comprising:
   depositing by vapor phase deposition at least one monolayer of a first titanium nitride film on a substrate;
   treating the first titanium nitride film with plasma excited hydrogen-containing gas, wherein the first titanium nitride film is polycrystalline and the treating increases (200) crystallographic texture of the first titanium nitride film;
   depositing by vapor phase deposition at least one monolayer of a second titanium nitride film on the treated at least one monolayer of the first titanium nitride film;
   treating the at least one monolayer of the second titanium nitride film with plasma excited hydrogen-containing gas; and
   performing atomic layer etching to thin a titanium nitride material containing the treated first and second titanium nitride films, wherein the thinned titanium nitride material has predominantly (200) crystallographic texture.

2. The method of claim 1, wherein a titanium nitride material containing the first and second titanium nitride films has predominantly (200) crystallographic texture.

3. The method of claim 1, further comprising sequentially repeating at least once the steps of depositing by vapor phase deposition at least one monolayer of the second titanium nitride film, and treating the at least one monolayer of the second titanium nitride film with plasma excited hydrogen-containing gas.

4. The method of claim 1, wherein a titanium nitride material containing the first and second titanium nitride films has predominantly (200) crystallographic texture.

5. The method of claim 1, wherein the depositing by vapor phase deposition at least one monolayer of the first titanium nitride film includes performing a first plurality of cycles of atomic layer deposition.

6. The method of claim 5, wherein the first plurality of cycles of atomic layer deposition includes alternating exposures of $TiCl_4$ gas and $NH_3$ gas.

7. The method of claim 1, wherein the depositing by vapor phase deposition at least one monolayer of the second titanium nitride film includes performing a second plurality of cycles of atomic layer deposition.

8. The method of claim 7, wherein the second plurality of cycles of atomic layer deposition includes alternating exposures of $TiCl_4$ gas and $NH_3$ gas.

9. The method of claim 1, wherein the plasma excited hydrogen-containing gas is formed using a microwave plasma source, an inductively coupled plasma (ICP) source, or a capacitively coupled plasma (CCP) source.

10. The method of claim 1, wherein the treating steps positively shift the threshold voltage of a titanium nitride material containing the first and second titanium nitride films.

11. The method of claim 1, wherein the hydrogen-containing gas is selected from the group consisting of $H_2$, $NH_3$, $N_2H_4$, H radicals, and a combination thereof.

12. A substrate processing method, comprising:
   depositing by vapor phase deposition at least one monolayer of a first titanium nitride film on a substrate;
   treating the first titanium nitride film with plasma excited hydrogen-containing gas, wherein the first titanium nitride film is polycrystalline and the treating increases (200) crystallographic texture of the first titanium nitride film;
   depositing by vapor phase deposition at least one monolayer of a second titanium nitride film on the treated at least one monolayer of the first titanium nitride film;
   treating the at least one monolayer of the second titanium nitride film with plasma excited hydrogen-containing gas; and
   performing etching to thin a titanium nitride material containing the treated first and second titanium nitride films, wherein the thinned titanium nitride material has predominantly (200) crystallographic texture.

13. The method of claim 12, wherein the etching is performed using gas mixture of $CHF_3$ and Ar, or a gas mixture of $Cl_2$ and Ar.

14. The method of claim 12, wherein the hydrogen-containing gas is selected from the group consisting of $H_2$, $NH_3$, $N_2H_4$, H radicals, and a combination thereof.

15. A substrate processing method, comprising:
   depositing by atomic layer deposition at least one monolayer of a first titanium nitride film on a substrate;
   treating the first titanium nitride film with plasma excited hydrogen-containing gas formed using a microwave plasma source, wherein the first titanium nitride film is polycrystalline and the treating increases (200) crystallographic texture of the first titanium nitride film;
   depositing by atomic layer deposition at least one monolayer of a second titanium nitride film on the treated at least one monolayer of the first titanium nitride film; and
   treating the at least one monolayer of the second titanium nitride film with plasma excited hydrogen-containing gas formed using the microwave plasma source, wherein the (200) crystallographic texture of treated first titanium nitride film aids in forming the second titanium nitride film also with predominantly (200) crystallographic texture, and a titanium nitride material containing the treated first and second titanium nitride films has predominantly (200) crystallographic texture; and
   performing etching to thin a titanium nitride material containing the treated first and second titanium nitride films, wherein the thinned titanium nitride material has predominantly (200) crystallographic texture.

16. The method of claim 15, wherein the depositing steps include a plurality of cycles of atomic layer deposition that include alternating exposures of $TiCl_4$ gas and $NH_3$ gas.

17. The method of claim 15, wherein the etching is performed using gas mixture of $CHF_3$ and Ar, or a gas mixture of $Cl_2$ and Ar.

18. The method of claim 15, wherein the hydrogen-containing gas is selected from the group consisting of $H_2$, $NH_3$, $N_2H_4$, H radicals, and a combination thereof.

* * * * *